United States Patent
Carter et al.

(10) Patent No.: US 8,742,669 B2
(45) Date of Patent: *Jun. 3, 2014

(54) PASSIVE POWER DISTRIBUTION FOR MULTIPLE ELECTRODE INDUCTIVE PLASMA SOURCE

(71) Applicant: Advanced Energy Industries, Inc., Fort Collins, CO (US)

(72) Inventors: Daniel Carter, Fort Collins, CO (US); Victor Brouk, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/681,258

(22) Filed: Nov. 19, 2012

(65) Prior Publication Data
US 2013/0320853 A1 Dec. 5, 2013

Related U.S. Application Data

(63) Continuation of application No. 12/698,007, filed on Feb. 1, 2010, now Pat. No. 8,319,436.

(51) Int. Cl.
*H01J 7/24* (2006.01)
(52) U.S. Cl.
USPC .................................. 315/111.51; 315/111.71
(58) Field of Classification Search
USPC .............. 315/111.21, 111.41, 111.51, 111.71
See application file for complete search history.

(56) References Cited

U.S. PATENT DOCUMENTS

| | | | |
|---|---|---|---|
| 5,517,084 A * | 5/1996 | Leung | 315/111.81 |
| 5,767,628 A * | 6/1998 | Keller et al. | 315/111.51 |
| 5,907,221 A | 5/1999 | Sato et al. | |
| 6,180,019 B1 | 1/2001 | Kazumi et al. | |
| 6,273,022 B1 | 8/2001 | Pu et al. | |
| 6,288,493 B1 * | 9/2001 | Lee et al. | 315/111.51 |
| 6,463,875 B1 | 10/2002 | Chen et al. | |
| 6,507,155 B1 | 1/2003 | Barnes et al. | |
| 6,568,346 B2 | 5/2003 | Pu et al. | |
| 6,583,572 B2 | 6/2003 | Veltrop et al. | |
| 6,617,794 B2 | 9/2003 | Barnes et al. | |
| 6,646,385 B2 | 11/2003 | Howald et al. | |

(Continued)

FOREIGN PATENT DOCUMENTS

JP 2007311182 11/2007

OTHER PUBLICATIONS

Ray, Jayati, "International Search Report re Application Nuber PCT/US10/022906", Mar. 21, 2010, Published in: US.

(Continued)

*Primary Examiner* — Tung X Le
(74) *Attorney, Agent, or Firm* — Neugeboren O'Dowd PC

(57) ABSTRACT

Systems, methods, and Apparatus for controlling the spatial distribution of a plasma in a processing chamber are disclosed. An exemplary system includes a primary inductor disposed to excite the plasma when power is actively applied to the primary inductor; at least one secondary inductor located in proximity to the primary inductor such that substantially all current that passes through the secondary inductor results from mutual inductance through the plasma with the primary inductor. In addition, at least one terminating element is coupled to the at least one secondary inductor, the at least one terminating element affecting the current through the at least one secondary inductor so as to affect the spatial distribution of the plasma.

12 Claims, 3 Drawing Sheets

(56) References Cited

U.S. PATENT DOCUMENTS

| | | |
|---|---|---|
| 6,685,798 B1 | 2/2004 | Holland et al. |
| 6,694,915 B1 | 2/2004 | Holland et al. |
| 6,756,737 B2 | 6/2004 | Doi et al. |
| 6,893,533 B2 | 5/2005 | Holland et al. |
| 6,924,455 B1 | 8/2005 | Chen et al. |
| 7,019,253 B2 | 3/2006 | Johnson |
| 7,096,819 B2 | 8/2006 | Chen et al. |
| 2002/0185228 A1 | 12/2002 | Chen et al. |
| 2004/0149218 A1 | 8/2004 | Collins et al. |

OTHER PUBLICATIONS

Bai, Lingfei, "International Preliminary Report on Patentability re Application No. PCT/US2010/022906", Aug. 11, 2011, p. 7 Published in: CH.

* cited by examiner

PASSIVE POWER DISTRIBUTION FOR MULTIPLE ELECTRODE INDUCTIVE PLASMA SOURCE

PRIORITY

This application is a continuation of U.S. patent application Ser. No. 12/698,007, entitled Passive Power Distribution for Multiple Electrode Inductive Plasma Source, which claims priority to provisional application No. 61/149,187, filed Feb. 2, 2009, entitled PASSIVE POWER DISTRIBUTION FOR MULTIPLE ELECTRODE INDUCTIVE PLASMA SOURCE.

FIELD OF THE INVENTION

The present invention relates generally to plasma processing. In particular, but not by way of limitation, the present invention relates to systems, methods and apparatuses for applying and distributing power to a multiple electrode inductive plasma processing chamber.

BACKGROUND OF THE INVENTION

Inductively coupled plasma processing systems are utilized to perform a variety of processes including etching processes and chemical vapor deposition processes. In many typical implementations, inductive coil antennas are wound around a reactive chamber and actively driven by RF power so as to prompt ignition of (and to maintain) a plasma in the chamber.

Systems have been developed to utilize a single generator to drive two coil antennas. In these systems, a generator is typically coupled (e.g., through an RF match) to the first coil and a series capacitor couples the first coil to the second coil so that the two coils are both actively driven by the generator (e.g., actively driven through an RF impedance match).

SUMMARY OF THE INVENTION

Exemplary embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents and alternative constructions that fall within the spirit and scope of the invention as expressed in the claims.

One embodiment of the invention may be characterized as a system for controlling the spatial distribution of plasma in a processing chamber. The system in this embodiment includes a primary inductor disposed to excite the plasma when power is actively applied to the primary inductor; at least one secondary inductor located in proximity to the primary inductor such that substantially all current that passes through the secondary inductor results from mutual inductance through the plasma with the primary inductor; and at least one terminating element coupled to the at least one secondary inductor, the at least one terminating element affecting the current through the at least one secondary inductor so as to affect the spatial distribution of the plasma.

Another embodiment may be characterized as a method for controlling a spatial distribution of plasma in a processing chamber that includes a primary inductor and N secondary inductors. The method includes exciting the plasma in the processing chamber with the primary inductor; inductively coupling the primary inductor to each of N secondary inductors through the plasma, wherein N is equal to or greater than one; and terminating each of the N secondary inductors such that substantially all current that passes through each of the N secondary inductors results from mutual inductance through the plasma with the primary inductor, the current through each of the N secondary inductors affecting the spatial distribution of the plasma.

Yet another embodiment of the invention may be characterized as an apparatus for controlling the spatial distribution of plasma in a processing chamber. The apparatus includes a primary terminal configured to couple to, and actively apply power to, a primary inductor of the plasma processing chamber; a secondary terminal configured to couple to a corresponding secondary inductor of the plasma processing chamber; and a terminating element coupled to the secondary terminal, the terminating element disposed to provide a path for current flowing through the secondary inductive component, wherein substantially all the current that passes through the secondary inductor and the terminating element results from mutual inductance through the plasma with the primary inductor.

BRIEF DESCRIPTION OF THE DRAWINGS

Various objects and advantages and a more complete understanding of the present invention are apparent and more readily appreciated by reference to the following Detailed Description and to the appended claims when taken in conjunction with the accompanying Drawings wherein:

DETAILED DESCRIPTION

Figure 1:
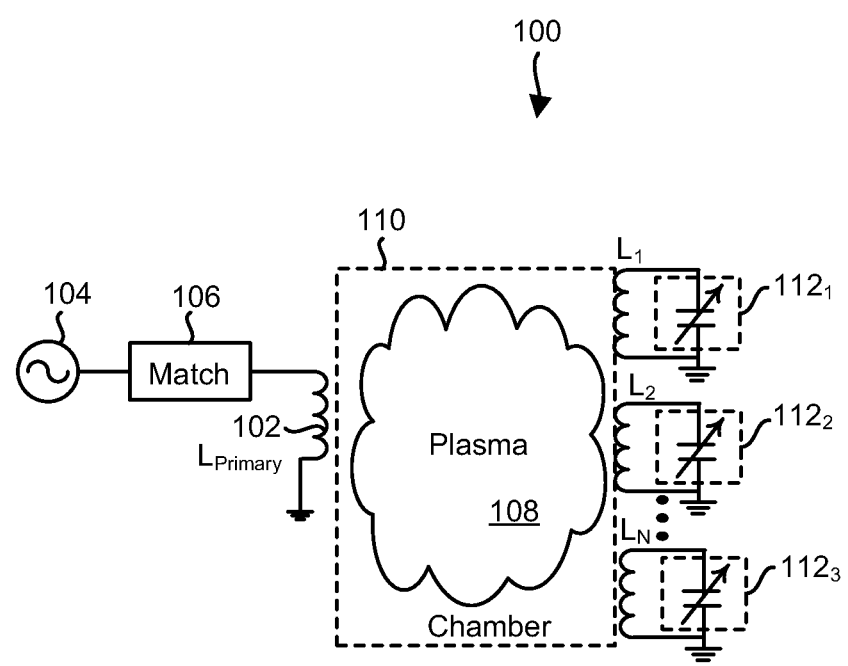
FIG. 1 is a block diagram depicting an exemplary embodiment of the invention.

Referring now to the drawings, where like or similar elements are designated with identical reference numerals throughout the several views, and referring in particular to FIG. 1, shown is an inductively-coupled plasma processing system 100 including a primary coil 102 that is actively driven by a generator 104 (via a match 106) to ignite and sustain a plasma 108 in a plasma processing chamber 110. As depicted, the exemplary system 100 includes N secondary coils $L_{1-N}$ that are inductively coupled to the plasma 108, and the plasma 108 is inductively coupled to the primary coil 102. As a consequence, the secondary coils $L_{1-N}$ are inductively coupled to the primary coil 102 via the plasma 108 so that power is applied to the secondary coils $L_{1-N}$ by the plasma 108.

As depicted, coupled to each of the N secondary coils $L_{1-N}$ are a corresponding one of N passive elements $112_{1-N}$, which passively terminate each of the N secondary coils $L_{1-N}$. This architecture is very different from known techniques (such as described above) that rely on actively driving each coil $L_{1-N}$. Beneficially, because the secondary inductors are not actively driven, the secondary coils may be placed about the chamber 110 with added ease and plasma spatial uniformity control is more conveniently achieved since the secondary inductors $L_{1-N}$ are driven by mutual coupling, through the plasma 108, to the primary coil 102, and as a consequence, lack the need for a direct power feed. Multiple secondary coils can be added in this manner beyond what is practical for adding multiple directly-powered secondary coils due to the inherent complexity and cost of additional powered feeds. Thus, plasma density may be manipulated in a more cost effective manner.

In operation, power is applied through the match 106 to the primary coil 102, which effectively applies power to the chamber 110, and once ignited, the plasma 108 effectively operates as a secondary of a transformer, and the current that is induced in the plasma 108 induces current in the secondary coils $L_{1-N}$. In turn, the current that is induced in the secondary coils $L_{1-N}$, induces current in the plasma 108 and affects the density of the plasma 108 in the regions proximate to each of the secondary coils $L_{1-N}$.

The N passive elements $112_{1-N}$, depicted as variable capacitors in the exemplary embodiment, enable the current through each of the N coils $L_{1-N}$ to be regulated; thus enabling the ratio of current between the primary 102 and the N secondary coils $L_{1-N}$ to be regulated. As a consequence, the plasma densities in regions proximate to each of the primary 102 and secondary coils $L_{1-N}$ may be regulated.

The generator 104 may be a 13.56 MHz generator, but this is certainly not required and other frequencies are certainly contemplated. And the match 106 may be realized by a variety of match network architectures. As one of ordinary skill in the art will appreciate, the match 106 is used to match the load of the plasma 108 to the generator 104. By correct design of the matching network 106 (either internal to the generator or external as shown in FIG. 1), it is possible to transform the impedance of the load to a value close to the desired load impedance of the generator.

Figure 2:
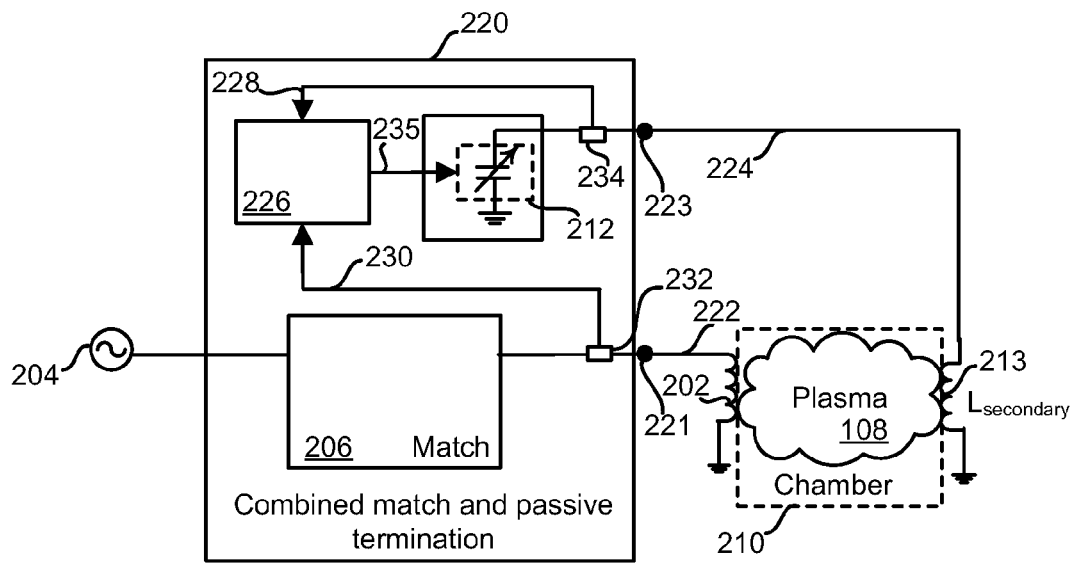
FIG. 2 is a block diagram depicting another exemplary embodiment of the invention.

Referring next to FIG. 2, shown is an exemplary embodiment in which the passive element (e.g., variable capacitor) and the match are both positioned within the same housing 220. As shown, at or near the housing 220 is a primary terminal 221 that is coupled to a first output conductor 222 that couples the generator 204 (through the match 206 and primary terminal 221) to a primary coil 202. And a secondary terminal 223, positioned at or near the housing 220, is coupled to a second output conductor 224 that couples a passive termination element 212 and secondary terminal 223 to a secondary coil 213. In addition, a control portion 226 (also referred to herein as a controller) is disposed to receive signals 228, 230 indicative of current levels (which are indicative of the density of the plasma 108 in the regions proximate to the coils 202, 213) in the first 222 and second 224 output conductors from first 232 and second 234 sensors (e.g., current transducers), respectively. And the control portion 226 is also arranged to control a value (e.g., capacitance) of the passive element 212 (e.g., variable capacitor).

In variations of the embodiment depicted in FIG. 2, instead of current sensors 232, 234 (or in addition to current sensors 232, 234) other sensing components (either within or outside of the housing 220) may be used to provide an indication of the plasma density in close proximity to the coils 213. For example, optical sensors may be used to sense plasma properties (e.g., plasma density).

It should be recognized that the depicted components in FIG. 2 is logical and not intended to be a hardware diagram. For example, the control portion 226 and the sensors 232, 234 may each be realized by distributed components, and may be implemented by hardware, firmware, software or a combination thereof. In many variations of the embodiment depicted in FIG. 2, the sensed current levels are converted to a digital representation, and the controller 226 uses the digital representation of the current signals 228, 230 to generate a control signal 235 to drive the passive element 212. In addition, the match 206 may be controlled by the control portion 226 or may be separately controlled.

It should also be recognized that, for simplicity, only one secondary coil 213 and one passive termination element 212 are depicted, but it is certainly contemplated that two or more secondary coils 213 may be implemented in connection with two or more passive termination elements 212 (e.g., two or more passive termination elements housed with the match).

In operation, the generator 204 applies power, through the match 206, to the primary coil 202 and the current in the primary coil 202 (which is sensed by the first sensor 232) induces current in the plasma 108, which in turn, induces current in the secondary coil 213. And the current flowing through the secondary coil 213, and hence the second output conductor 224 and secondary terminal 223, is sensed by the second sensor 234. As discussed with reference to FIG. 1, unlike prior art implementations, the power that is applied by the secondary coil 213 to the plasma 108 is derived from current flowing through the primary coil 202. More particularly, the secondary coil 212 obtains power from the primary coil 202 through the plasma 108.

The control portion 226, sensors 232, 234, and passive element(s) 212 collectively form a control system to control aspects of the plasma (e.g., the spatial distribution of the plasma). The control portion 226 in this embodiment is configured, responsive to the relative current levels in the primary 202 and secondary 213 coils, to alter the value (e.g., the capacitance) of the passive element 212 (e.g., variable capacitor) so that the ratio of current between the primary 202 and secondary 213 coils is at a value that corresponds to a desired plasma density profile within the chamber 210. Although not shown, the control portion 226 may include a man-machine interface (e.g., display and input controls) to enable a user to receive feedback and facilitate control of the plasma 108.

Figure 3:
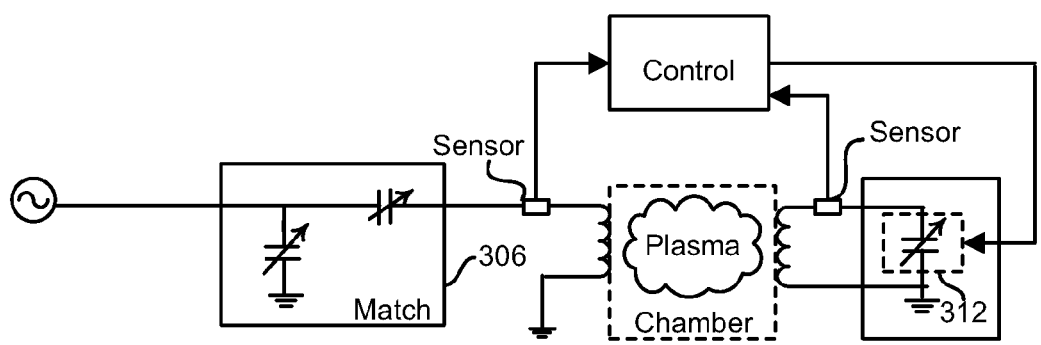
FIG. 3 is a block diagram depicting yet another embodiment of the invention.

Referring next to FIG. 3, shown is another embodiment in which the passive termination element is implemented in a separate housing (separate from the match and controller) in close proximity with a chamber. The components in the present embodiment operate in a substantially similar manner as the components depicted in FIG. 2, but the passive element 312 may be implemented as a separate appliance or may be integrated with the chamber 310.

Figure 4:
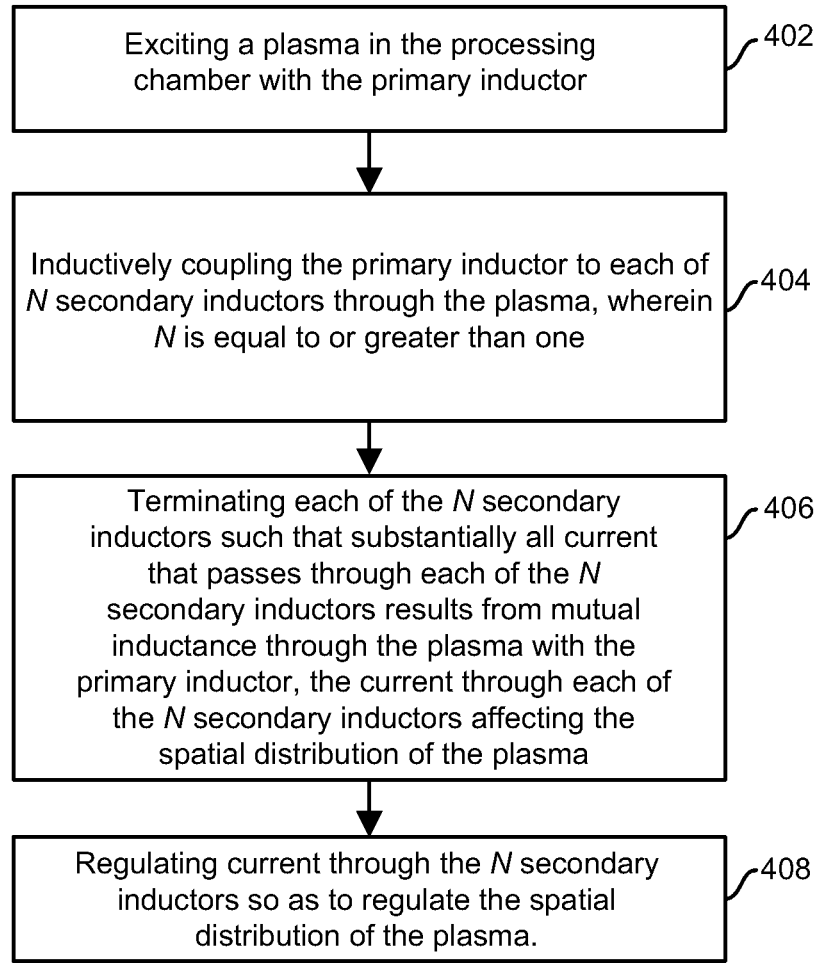
FIG. 4 is a flowchart depicting a method that may be traversed in connection with the embodiments described with reference to FIGS. 1-3.

Referring next to FIG. 4, it is a flowchart depicting steps that may be traversed in connection with the embodiments described with reference to FIGS. 1-3 for controlling the spatial distribution of plasma in a processing chamber (e.g., chamber 110, 210). As depicted, when power is applied (e.g., directly applied by generator 104, 204 via match) to a primary inductor (e.g., the primary coil 102, 202), a plasma in the chamber is excited (Block 402). In addition, the primary inductor is inductively coupled to each of N (N is equal to or greater than one) secondary conductors (e.g., secondary coils $L_{1-N}$, 213) through the plasma (Block 404), and each of the N secondary inductors is terminated such that substantially all current that passes through each of the N secondary inductors results from mutual inductance through the plasma with the primary inductor (Block 406). As previously discussed, the current through each of the N secondary inductors affects the spatial distribution of the plasma. Although not required, in some variations, the current through the N secondary inductors is regulated so as to regulate the spatial distribution of the plasma (Block 408).

In conclusion, the present invention provides, among other things, a method, system, and apparatus that enables controllable plasma density with an actively driven coil and one or more passively terminated inductors. Those skilled in the art can readily recognize that numerous variations and substitutions may be made in the invention, its use, and its configuration to achieve substantially the same results as achieved by the embodiments described herein. Accordingly, there is no intention to limit the invention to the disclosed exemplary forms. Many variations, modifications, and alternative constructions fall within the scope and spirit of the disclosed invention.

What is claimed is:

1. A method for controlling a spatial distribution of plasma in a processing chamber that includes a primary inductor and N secondary inductors, comprising:
   exciting the plasma in the processing chamber with the primary inductor;
   inductively coupling the primary inductor to each of N secondary inductors through the plasma, wherein N is equal to or greater than one; and
   terminating each of the N secondary inductors such that substantially all current that passes through each of the N secondary inductors results from mutual inductance through the plasma with the primary inductor, the current through each of the N secondary inductors affecting the spatial distribution of the plasma.

2. The method of claim 1, wherein terminating each of the N secondary inductors includes passively terminating each of the N secondary inductors.

3. The method of claim 1, including regulating current through the N secondary inductors so as to regulate the spatial distribution of the plasma.

4. The method of claim 3, wherein terminating includes terminating each of the N secondary inductors with an impedance-adjustable termination element, and regulating current through the N secondary inductors includes regulating the current by adjusting an impedance of each of the impedance-adjustable termination elements.

5. The method of claim 4, including:
   sensing at least one parameter indicative of plasma density in regions proximal to the N secondary inductors, and adjusting the impedance of the impedance-adjustable termination elements responsive to the sensing.

6. The method of claim 5, including sensing current in each of the N secondary inductors, and adjusting the impedance of the impedance-adjustable termination elements by adjusting a capacitance of the impedance-adjustable termination elements.

7. A system for controlling a spatial distribution of plasma in a processing chamber that includes a primary inductor and N secondary inductors, comprising:
   means for exciting the plasma in the processing chamber with the primary inductor;
   means for inductively coupling the primary inductor to each of N secondary inductors through the plasma, wherein N is equal to or greater than one; and
   means for terminating each of the N secondary inductors such that substantially all current that passes through each of the N secondary inductors results from mutual inductance through the plasma with the primary inductor, the current through each of the N secondary inductors affecting the spatial distribution of the plasma.

8. The system of claim 7, wherein the means for terminating each of the N secondary inductors includes means for passively terminating each of the N secondary inductors.

9. The system of claim 7, including means for regulating current through the N secondary inductors so as to regulate the spatial distribution of the plasma.

10. The system of claim 9, wherein the means for terminating includes means for terminating each of the N secondary inductors with an impedance-adjustable termination element, and the means for regulating current through the N secondary inductors includes means for adjusting an impedance of each of the impedance-adjustable termination elements.

11. The system of claim 10, including:
    means for sensing at least one parameter indicative of plasma density in regions proximal to the N secondary inductors, and means for adjusting the impedance of the impedance-adjustable termination elements responsive to the sensing.

12. The system of claim 11, including means for sensing current in each of the N secondary inductors, and means for adjusting a capacitance of the impedance-adjustable termination elements.

* * * * *